United States Patent [19]

Schoellkopf

[11] Patent Number: 5,568,072

[45] Date of Patent: Oct. 22, 1996

[54] CIRCUIT INDICATING THE PHASE RELATION BETWEEN SEVERAL SIGNALS HAVING THE SAME FREQUENCY

[75] Inventor: Jean-Pierre Schoellkopf, Grenoble, France

[73] Assignee: SGS-Thomson Microelectronics S.A., Saint-Genis Pouilly, France

[21] Appl. No.: 317,132

[22] Filed: Oct. 3, 1994

[30] Foreign Application Priority Data

Oct. 11, 1993 [FR] France .................. 93 12452

[51] Int. Cl.$^6$ .................. H03K 5/13; H03L 7/00
[52] U.S. Cl. .................. 327/12; 327/19; 327/244; 327/146; 327/153; 327/276
[58] Field of Search .................. 327/2, 3, 146, 327/147, 149, 150, 152, 153, 156, 158, 159, 161, 163, 170, 233, 234, 235, 236, 241, 243, 244, 245, 250, 251, 19, 12, 5, 144, 145, 155, 270, 276, 269

[56] References Cited

U.S. PATENT DOCUMENTS

| | | | |
|---|---|---|---|
| 4,178,554 | 12/1979 | Sase et al. | 327/12 |
| 4,604,582 | 8/1986 | Strenkowski et al. | 327/152 |
| 4,639,615 | 1/1987 | Lee et al. | 307/269 |
| 5,036,230 | 7/1991 | Bazes | 307/527 |
| 5,059,833 | 10/1991 | Fujii | 327/12 |
| 5,087,829 | 2/1992 | Ishibashi et al. | 327/244 |
| 5,118,975 | 6/1992 | Hillis et al. | 327/244 |
| 5,146,121 | 9/1992 | Searles et al. | 327/244 |
| 5,164,677 | 11/1992 | Hawkins et al. | 327/250 |
| 5,216,302 | 6/1993 | Tanizawa | 327/244 |
| 5,338,990 | 8/1994 | Lou | 327/141 |
| 5,416,444 | 5/1995 | Yamauchi et al. | 327/3 |

OTHER PUBLICATIONS

IBM Technical Disclosure Bulletin, vol. 30, No. 11, Apr. 1988 Armonk, US pp. 394–396 "Low–Cost Clock Generation Circuit".

Primary Examiner—Timothy P. Callahan
Assistant Examiner—Eunja Shin
Attorney, Agent, or Firm—David M. Driscoll; James H. Morris

[57] ABSTRACT

A circuit, indicating the first or last signal activated among n signals, includes flip-flops respectively associated with pairs of signals, a first signal of each pair being applied to a reset input of a flip-flop and a second signal of each pair being applied to a set input. Logic gates are respectively associated with each considered signal and are connected to indicate whether the considered signal is the first or the last activated signal when the flip-flops associated with all the pairs of signals including the considered signal are at respective suitable states once the first or last signal is activated.

29 Claims, 5 Drawing Sheets

5,568,072

CIRCUIT INDICATING THE PHASE RELATION BETWEEN SEVERAL SIGNALS HAVING THE SAME FREQUENCY

BACKGROUND OF THE INVENTION

1. Field of the Invention

The present invention relates to electronic circuits some elements of which need a clock supplying several clock signals having a same frequency and normally a same phase, and more particularly to a circuit that prevents a phase shift between these clock signals from being too large.

2. Discussion of the Related Art

A large number of circuits include elements, such as flip-flops, counters, etc., which must be synchronized on a common clock signal. On an integrated circuit chip, several elements to be synchronized are distributed, so that the clock signal is provided to those elements through links of distinct lengths, some of the links being substantially longer than others. On an integrated circuit chip, the capacitance of a link increases with its length. A clock link is generally controlled by an amplifier providing a maximum current that is determined by the size of its transistors. Thus, the slope of the edges of a clock signal provided on a line increases with the maximum current of the amplifier and decreases with the length of the line (the line capacitance). A clock signal must exhibit steep edges. Accordingly, if the length of the clock lines is great, the output current of the amplifier must be increased. However, if the current in a line is increased beyond a specific limit, the section of the line must also be increased to prevent the line from being damaged. Generally, the increase in the line section is obtained by increasing the width of the conductors on the chip. This width increase is limited and is often incompatible with a large number of integrated circuit design systems since this increase causes, not only an increase of the chip surface area, but also problems for placing and routing the chip elements.

FIG. 1 represents a commonly used method for distributing a clock on an integrated circuit chip. The integrated circuit elements are grouped in several areas 10 having a compact shape (i.e., a shape that is rectangular or nearly square), so that the links inside these areas each have a length that is as short as possible. To each area 10 a distinct clock signal CK1, CK2, ... is provided through a respective current amplifier 12. All amplifiers 12 receive a global clock signal CK0 provided by a clock generator 14 through an amplifier 16.

With this configuration, each clock signal CK1, CK2, ... is provided to a line having a reduced length. Accordingly, to obtain clock signals with edges having a suitable slope, these clock lines do not need to be supplied with very high currents which would require increasing their width.

However, lines CK1, CK2, etc., generally have dissimilar lengths and accordingly dissimilar capacitances. Since amplifiers 12 have substantially identical characteristics, edges with dissimilar slopes are obtained on the clock lines. These dissimilar slopes cause phase-shiftings (skews) between the clock signals. As explained hereinafter, an excessive skew between two clock signals can be detrimental.

To reduce the skew, the shortest clock lines can be lengthened. This method not only complicates the integrated circuit design and increases the chip surface area, but also provides undetermined results depending upon the technology that is used to fabricate the integrated circuit.

Accordingly, a skew will still remain between the various clock signals, even if precautions are taken.

Shift registers are particularly sensitive to skews between the clock signals, when the flip-flops of the registers are in different areas 10, that is, when they are enabled by distinct clock signals.

FIG. 2 represents two D-type flip-flops 20 and 21 connected according to a shift register configuration. Flip-flop 20 is enabled, for example, by the clock signal CK1 and receives a signal to be shifted, for example from a preceding flip-flop, on an input D. Flip-flop 21 is enabled by the clock signal CK2, for example, and receives at its input D the output Q1 of flip-flop 20. In the following example, it is assumed that the input D of flip-flop 20 is at 0 and the outputs Q1 and Q2 are at 1 and 0, respectively.

In normal operation, the 0 at the input of flip-flop 20 is provided to the output Q1 and the 1 of output Q1 is provided to the output Q2 upon the substantially simultaneous occurrence of the two rising edges of signals CK1 and CK2.

FIG. 3A is a timing diagram illustrating the normal operation of the shift register of FIG. 2, in the worst case when the clock signal CK1 is in phase advance by a duration Ts with respect to the clock signal CK2.

At time $t_1$, a rising edge of the clock signal CK1 occurs. The input D of the flip-flop 20 is at 0, the output Q1 of flip-flop 20 is at 1 and the output Q2 of flip-flop 21 is at 0. The flip-flop 20 reacts to this rising edge with a delay Tp referred to as a propagation time of the flip-flop. Thus, at time $t_3=t_1+Tp$, the output Q1 switches to 0, which is the state present at the input D of flip-flop 20 at time $t_1$.

In the meantime, at time $t_2=t_1+Ts$, a rising edge of the clock signal CK2 occurs. Like the flip-flop 20, the state of the output Q2 of the flip-flop 21 switches with some delay at time $t_4=t_2+Tp$. The output Q2 of flip-flop 21 goes to 1, which is the state present at the input of flip-flop 21 at time $t_2$.

A flip-flop exhibits a so-called holding time Th corresponding to the minimum period during which a state must be maintained at the flip-flop input after its enable time so that this value is effectively taken into account (i.e., transmitted to the flip-flop output). If the signal is not maintained during time Th, the flip-flop erroneously operates. In the example of FIG. 3A, the holding time Th of flip-flop 21 is assumed to be sufficient, which means that Ts<Tp–Th.

FIG. 3B represents an erroneous operation. With respect to the case of FIG. 3A, the skew Ts between the clock signals CK1 and CK2 is increased, so that Ts>Tp–Th. At time $t_4$, the output Q2 switches to the state taken by the output Q1 after time $t_3$, that is the state is held at 0 instead of switching to 1; state 1 is lost.

SUMMARY OF THE INVENTION

An object of the present invention is to provide a circuit for automatically reducing the skew between several clock signals.

To achieve this object, the present invention provides a circuit for indicating the first or last signal activated among n signals. This circuit includes flip-flops respectively associated with pairs of signals, a first signal of each pair being applied to a reset input of the flip-flop and a second signal of each pair being applied to a set input. Logic gates are respectively associated with each considered signal, and are connected to indicate whether the considered signal is the first or the last activated signal when the flip-flops associated with all the pairs of signals including the considered signal are at respective suitable states after the activation of the first or last activated signal.

According to an embodiment of the invention, the circuit includes a flip-flop for each pair of signals, the pairs being formed so that two distinct signals occur only once in a pair, and a gate associated with a considered signal. The gate is enabled either when the flip-flops associated with the signal pairs, the considered signal of which is the first signal, are in a first state, or when the flip-flops associated with the signal pairs, the considered signal of which is the second signal, are in a second state, opposite to the first state.

According to an embodiment of the present invention, the signals are periodic signals having the same frequency. The states of the gates are provided to flip-flops of a register that is enabled when all the signals are in an active state.

According to an embodiment of the present invention, there is provided a circuit for adjusting the skew between several clock signals that have the same frequency and are respectively provided by amplifiers. The output impedance of each amplifier is adjustable. The circuit includes the above mentioned indication circuit for indicating the clock signal having the maximum phase lag, and a control circuit for controlling the increase of the output impedances of the amplifiers associated with the clock signals different from the clock signal having the maximum phase lag.

According to an embodiment of the present invention, the control circuit includes means for incrementing the impedance of an amplifier associated with a signal in advance of phase until the switching of the flip-flop associated with the pair of signals including the signal having the maximum phase lag and the signal in advance of phase.

According to an embodiment of the present invention, each amplifier includes a plurality of inverters that may be individually connected in parallel with a first inverter, depending on the state of a register whose content is modified by successive pulses provided by the control circuit.

The foregoing and other objects, features, aspects and advantages of the invention will become apparent from the following detailed description of the present invention when taken in conjunction with the accompanying drawings.

DETAILED DESCRIPTION

The present invention aims at adjusting to a minimum value the skew between clock signals, to prevent an excessive skew between two signals from causing an erroneous operation of flip-flops or other elements of a circuit. An aspect of the present invention is to provide a circuit indicating the phase relations between clock signals.

Figure 4A:
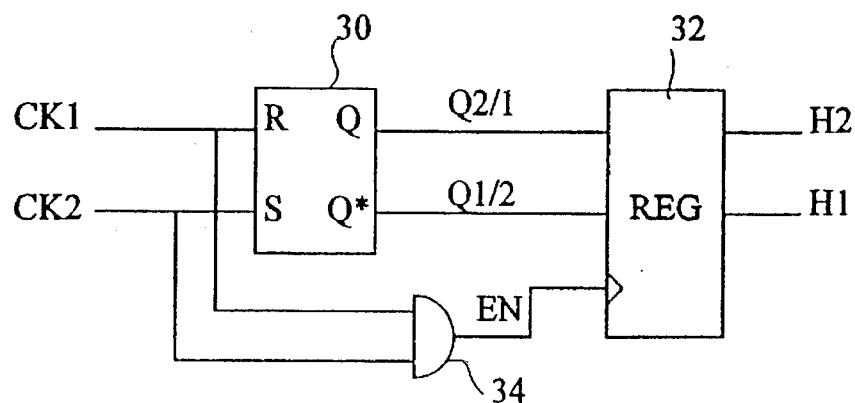
FIG. 4A represents a simplified embodiment of a circuit according to the invention for indicating the signal having the minimum (or maximum) skew between two clock signals.

FIG. 4A illustrates, with a simplified example including two clock signals CK1 and CK2, the principle of a circuit providing an indication of a phase relation. This circuit includes an RS flip-flop 30, receiving on a reset input R, a clock signal CK1, and on a set input S, a clock signal CK2.

When a 1 is present at input S and a 0 is present at input R, an output Q of flip-flop 30 is set to 1 and an inverted output Q* is set to 0. When a 1 is present at input R and a 0 is present at input S, the output Q is set to 0 and the inverted output Q* is set to 1. When the states on inputs R and S are identical, the state of the flip-flop is unchanged. The signal on output Q is labeled Q2/1 and the signal on the inverted output Q* is labeled Q1/2.

With this configuration, the output Q1/2 indicates, by switching to 1 after a rising edge of signal CK1, that the signal CK1 is in advance of phase with respect to signal CK2. The output Q2/1 is the logic complement of output Q1/2, and indicates, by switching to 1 after a rising edge of signal CK2, that the signal CK2 is in advance of phase with respect to signal CK1. The outputs Q2/1 and Q1/2 are stored in a register 32 so as to continuously provide the phase relation between clocks CK1 and CK2. The register 32 is enabled by the output EN of an AND gate 34 receiving signals CK1 and CK2. The outputs Q1/2 and Q2/1 stored in register 32 are labeled H1 and H2, respectively.

Figure 4B:
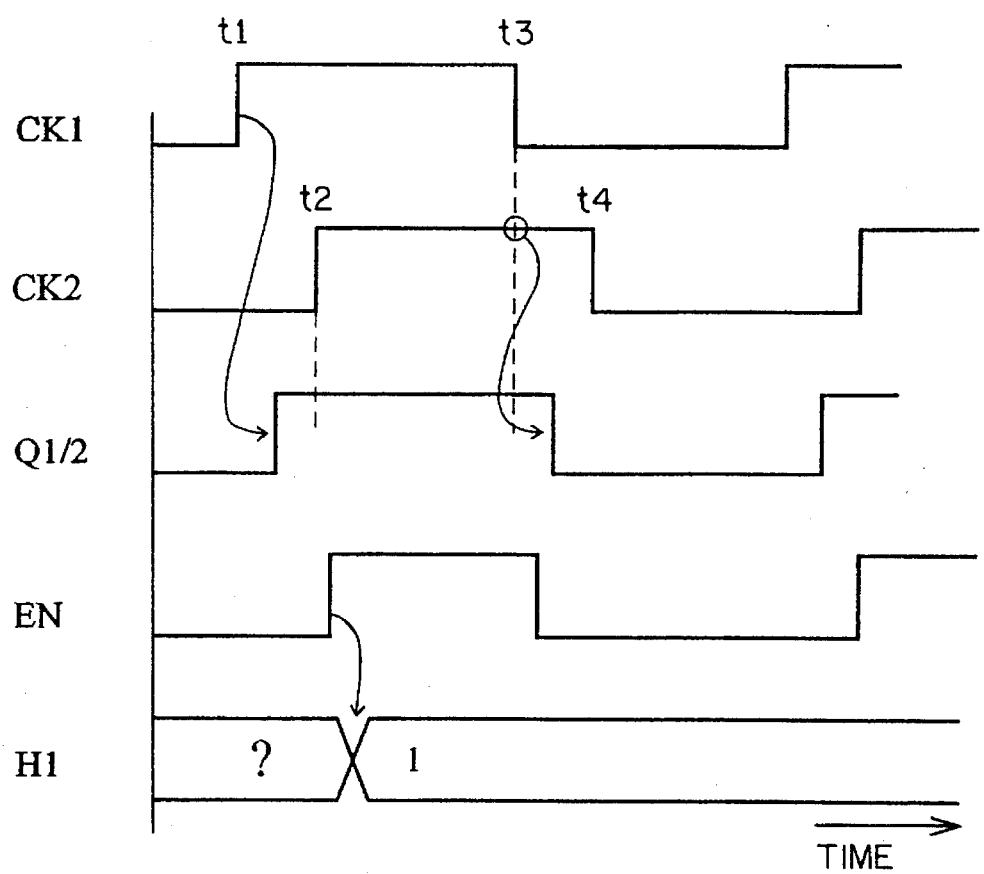
FIG. 4B is a timing diagram of the operation of the circuit of FIG. 4A.

FIG. 4B is a timing diagram of the operation of the circuit of FIG. 4A.

At time t1, a rising edge of signal CK1, which is in advance of phase with respect to signal CK2, occurs. Signals CK2, Q1/2, and EN are at 0. The signal H1 is in an arbitrary state. This rising edge of signal CK1 causes, after a propagation delay, the switching to 1 of the output Q1/2 (and the switching to 0 of output Q2/1).

At a subsequent time t2, a rising edge of signal CK2 occurs. The signal CK1 is still at 1; the output EN of the AND gate 34 goes to 1, thus causing the enabling of register 32. The output Q1/2, at 1, is stored in register 32; the signal H1 switches to 1 (and the signal H2 switches to 0).

At time t3, a falling edge of signal CK1 occurs, but signal CK2 is still at 1; the output Q1/2 goes to 0 shortly after time t3. This switching to 0 of output Q1/2 does not affect the signal H1 whose state remains stored in register 32.

At time t4, a falling edge of signal CK2 occurs.

As long as signal CK1 is in advance of phase with respect to signal CK2, signal H1 remains at 1 to continuously indicate this phase relation. Similarly, signal H2 remains at 0 to indicate that signal CK2 is in phase lag with respect to signal CK1. If, over time, the phase relation between signals CK1 and CK2 is inverted, the states of signals H1 and H2 are inverted, in the way described for time t2, to indicate this new phase relation.

Figure 5:
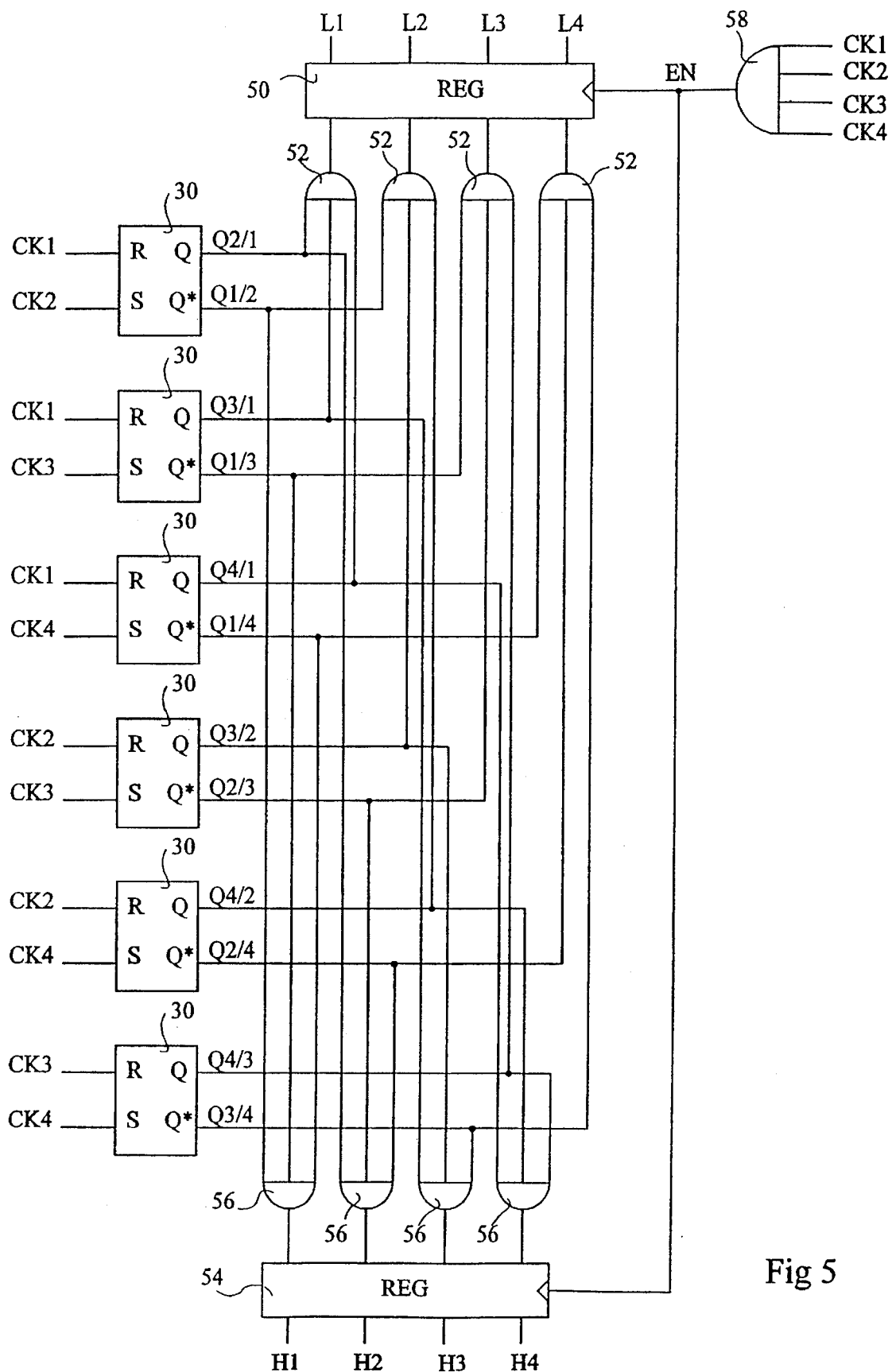
FIG. 5 represents an embodiment of an indication circuit according to the invention designed to process four clock signals.

FIG. 5 represents an embodiment of the circuit for indicating, among n clock signals CK1–CKn, the two signals having the maximum and the minimum phase lag, respectively. The example shown corresponds to n=4.

The circuit requires at least $n(n-1)/2$ RS flip-flops 30, each being associated with a pair of clock signals CKi, CKj, where i, j=1, 2, ..., n and i<j. A flip-flop 30 receiving on its reset input R a signal CKi, and receiving on its set input S a signal CKj, provides a signal Qj/i at its non-inverted output, and a signal Qi/j at its inverted output. A signal Qi/j indicates by switching to 1 after a rising edge of signal CKi, that signal CKi is in advance of phase with respect to signal CKj. By storing the pairs of outputs Qi/j, Qj/i, as it was done for the pair Q1/2 and Q2/1 of FIG. 4A, all the possible indications about the phase relations are obtained.

Furthermore, the circuit is designed to indicate on lines L1–Ln the clock signal having the maximum phase lag with respect to the other clock signals and to indicate on lines H1–Hn the clock signal having the maximum phase advance with respect to the other clock signals. More precisely, a line Lp (where p=1, 2, ..., n) at 1 indicates that the clock signal CKp is the signal having the maximum phase lag, and a line Hq (where q=1, 2, ..., n) at 1 indicates that the clock signal CKq is the signal with the maximum phase advance.

To achieve this purpose, a signal Lp corresponds to the output, that is periodically stored in a register 50, of a respective AND gate 52 receiving each output Qj/p (where j=1, 2, ..., n and j≠p) of flip-flops 30. Thus, the signal Lp is activated when each flip-flop 30 receiving the clock signal CKp indicates by one of its outputs Q that the signal CKp is lagging with respect to the other clock signal received by flip-flop 30.

A signal Hp corresponds to the output, that is periodically stored in a register 54, of a respective AND gate 56 receiving each output Qq/j (where j=1, 2, ..., n and j≠q) of flip-flops 30. Thus a signal Hq is activated when each flip-flop 30 receiving the clock signal CKq indicates by one of its outputs Q that the clock signal CKq is in advance with respect to the other clock signal received by flip-flop 30.

The registers 50 and 54 are enabled after each last rising edge of signals CK1–CKn, for example by the EN output of an AND gate 58 receiving signals CK1–CKn.

As is apparent to those skilled in the art various modifications can be made to the indication circuit of FIG. 5. It is possible to use only one output Q of flip-flops 30, for example the output that is connected to the AND gates 52, the AND gates 56 being replaced by NOR gates receiving the same signals as the AND gates 52. The indication circuit of FIG. 5 has many other applications than those described hereinafter. The circuit can be used with any group of signals having a repetitive variation over the time and which are such that the active edge of the most delayed signal occurs before the inactive edge of the signal with the maximum phase advance. The circuit can, for example, detect the first request among a group of requests having the same priority arriving on a microprocessor. By using multiplexers adequately controlled by signals L1–Ln and H1–Hn, the circuit can provide the clock signal having the maximum phase advance and/or the clock signal having the maximum phase lag.

Figure 1:
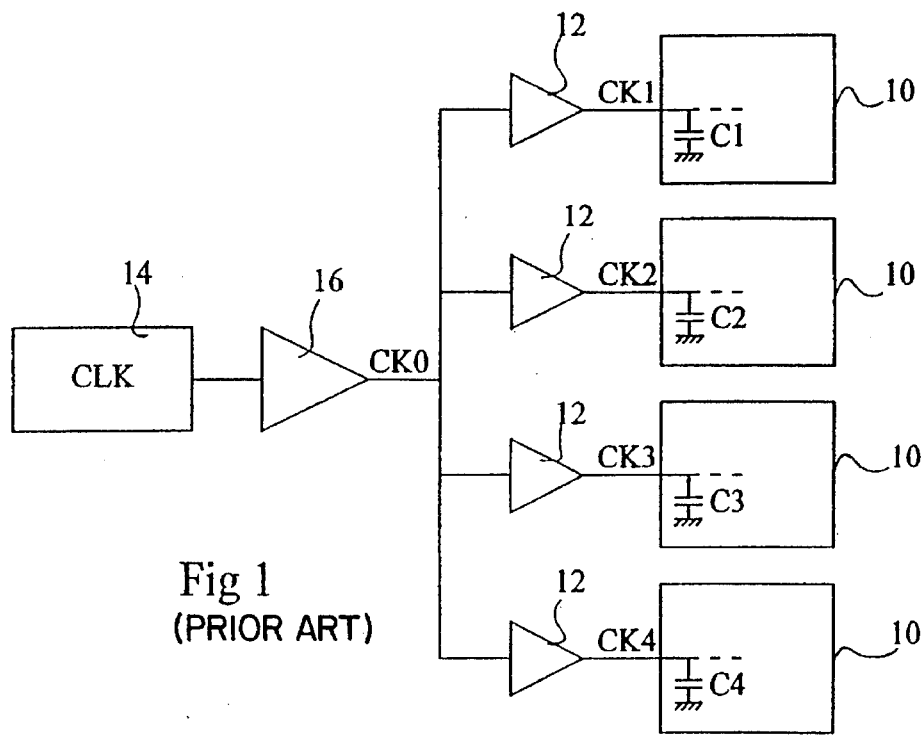
FIG. 1, above described, represents a conventional clock distribution circuit used in an electronic circuit.
Figure 2:
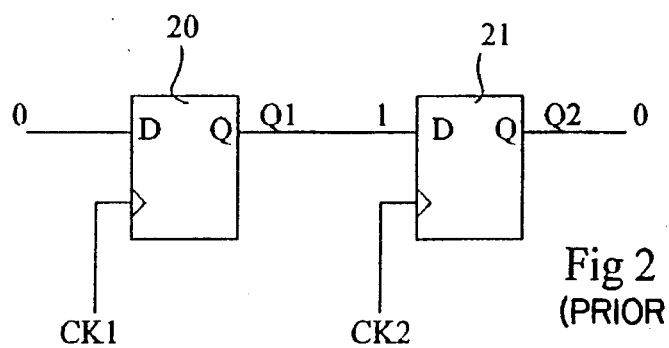
FIG. 2 represents a conventional shift register.
Figure 3A:
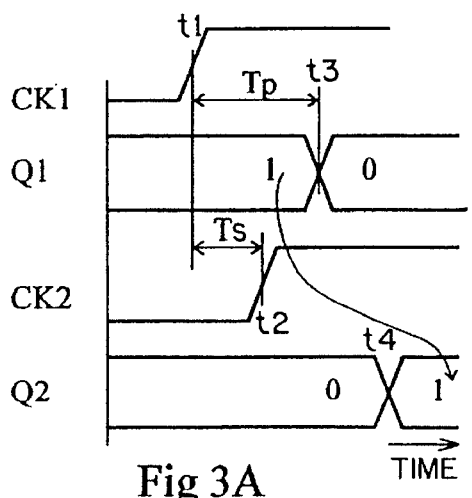
FIG. 3A and 3B are timing diagrams illustrating a correct and an erroneous operation, respectively, of the shift register of FIG. 2.
Figure 3B:
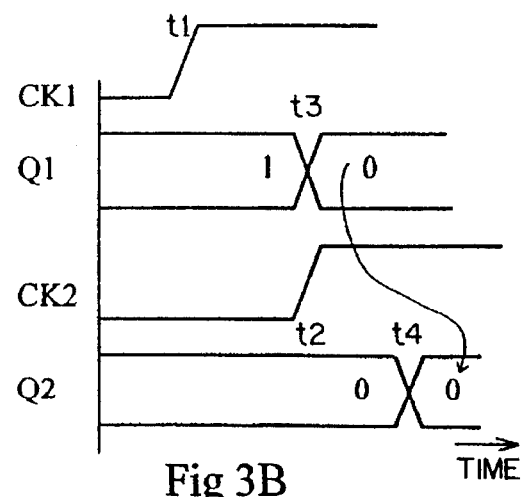
Figure 6:
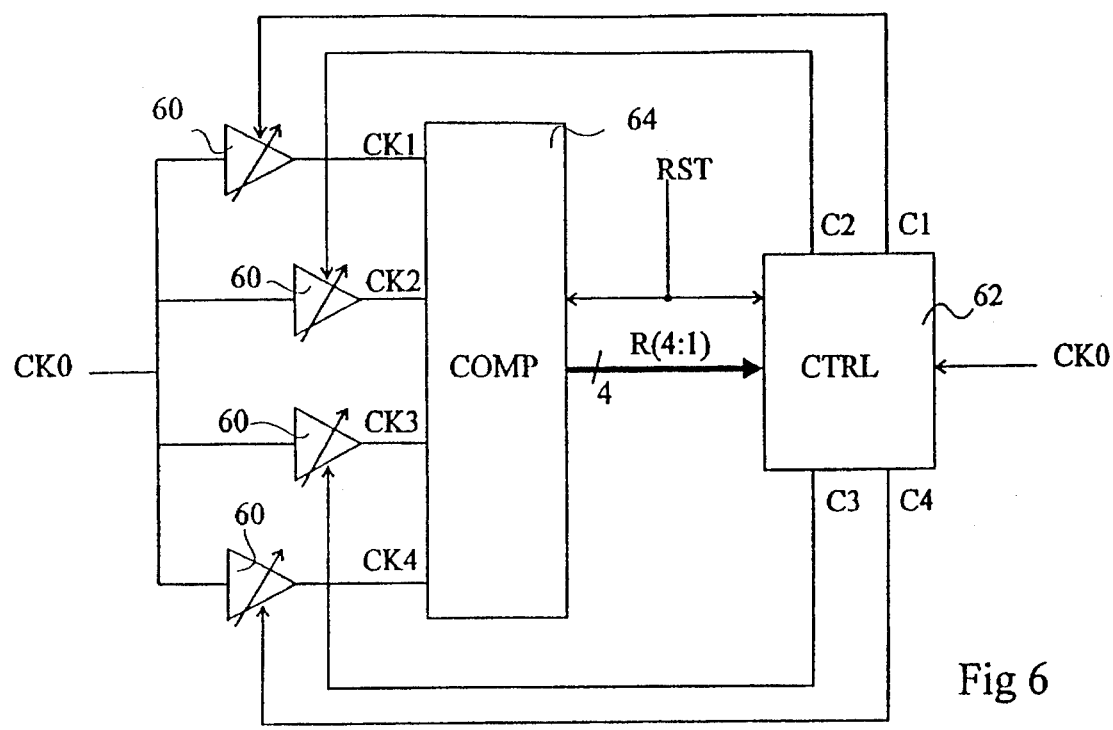
FIG. 6 represents an embodiment of a circuit according to the invention for adjusting the skew between several clock signals.

FIG. 6 represents an embodiment of the circuit according to the invention for adjusting the skew between clock signals CK1–CKn to a minimum value. This circuit is designed to detect the clock signal having the maximum phase lag and to increase the output impedance of the amplifiers (FIG. 1) provided to the other clock signals, so as to delay the phases of these other signals to a value close to the maximum phase lag. Indeed, by increasing the impedance of an amplifier, the slope of the clock signal edges it provides is decreased, which corresponds to increasing the phase lag of this clock signal.

Each clock signal CK1–CKn is provided by a respective amplifier 60 having an adjustable output impedance. The amplifiers 60, like the amplifiers in FIG. 1, receive a common clock signal CK0. The output impedance of amplifiers 60 is adjusted by respective signals C1–Cn provided by a control circuit 62 that takes into account the states of n lines R1–Rn. This indication circuit is timed by the global clock signal CK0, for example. The states of lines R constitute the result provided by a comparison circuit 64 receiving the clock signals CK1–CKn. The comparison circuit 64, an embodiment of which is described hereinafter with relation to FIG. 7, and the control circuit 62 receive an initialization signal RST.

The results R provided by the comparison circuit 64 are established as follows, further to an initialization signal RST. A line Rp (where p=1, 2, ..., n) is reset when the signal CKp is the signal having the maximum phase lag. The other lines Rj (where j=1, 2, ..., n and j≠p) indicate by a state 1 that the signals CKj are in phase advance with respect to signal CKp.

The control circuit 62 is designed to increment the output impedance of amplifier 60 that is associated with each signal CKj until the line Rj switches to 0, thus indicating that the clock signal CKj is lagging with respect to the clock signal CKp.

According to an embodiment, that will be described with more detail hereinafter, the impedances of amplifiers 60 are increased by successive steps once they are initialized, by the signal RST, at their minimum values. The control circuit 62, to increase an impedance step by step, provides as many pulses (C1–Cn) as there are steps on the adequate control line C. Such a control circuit can readily be realized by those skilled in the art with logic gates. Each signal Ci, for example, is provided by an AND gate receiving the signal Ri and the clock signal CK0.

At the end of an adjustment phase, when all the lines R are at 0, the clock signals which were in phase advance with respect to the signal CKp are all in phase lag with respect to signal CKp. Such an adjustment phase is carried out each time an initialization signal RST is activated. Signal RST is activated at the powering on of the circuit, for example, or periodically.

Figure 7:
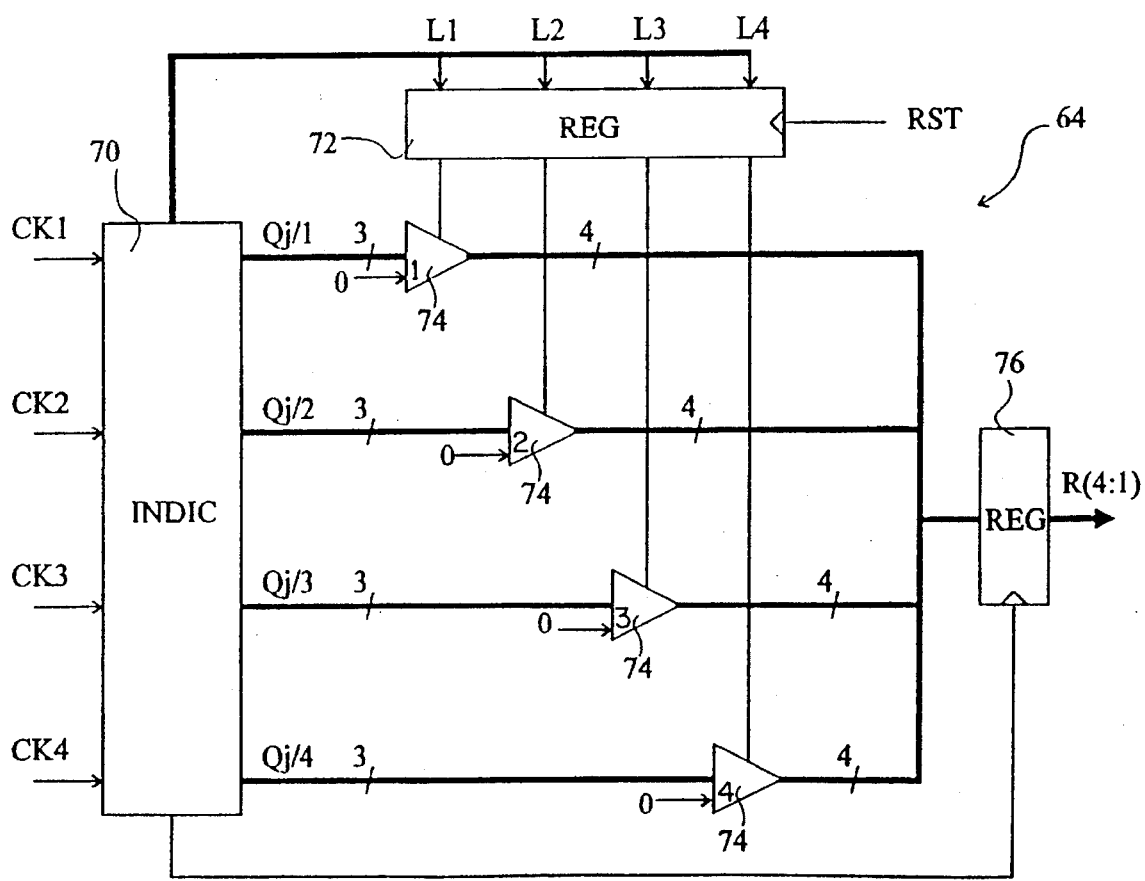
FIG. 7 represents in more detail an element of the circuit of FIG. 6.

FIG. 7 represents an embodiment of the comparison circuit 64. Circuit 64 includes an indication circuit 70 such as the one described with relation to FIG. 5. Lines Li–Ln, indicating the clock signal having the maximum phase lag, are provided to a register 72 that is enabled by signal RST. The bit of register 72 corresponding to a line Lp (where p=1, 2, ..., n) controls a respective three-state gate 74 having n channels of rank 1–n corresponding to ranks 1–n of the result lines R, respectively. The channel with rank p of the three-state gate 74 associated with line Lp receives value 0 and the channels of rank j (where j=1, 2, ..., n and j≠p) receive the outputs Qj/p of flip-flops 30 of the indication circuit 70, respectively. The outputs of the three-state gates 74 are merged in n lines connected to the input of a register 76. Register 76 is enabled by the signal EN provided by the indication circuit 70 and contains the above mentioned result R.

With this configuration, when a line Lp is active, the result line Rp is at 0 and every other result line Rj is set to the state of the output Qj/p which indicates whether the signal CKj is in advance with respect to the signal CKp.

Figure 8:
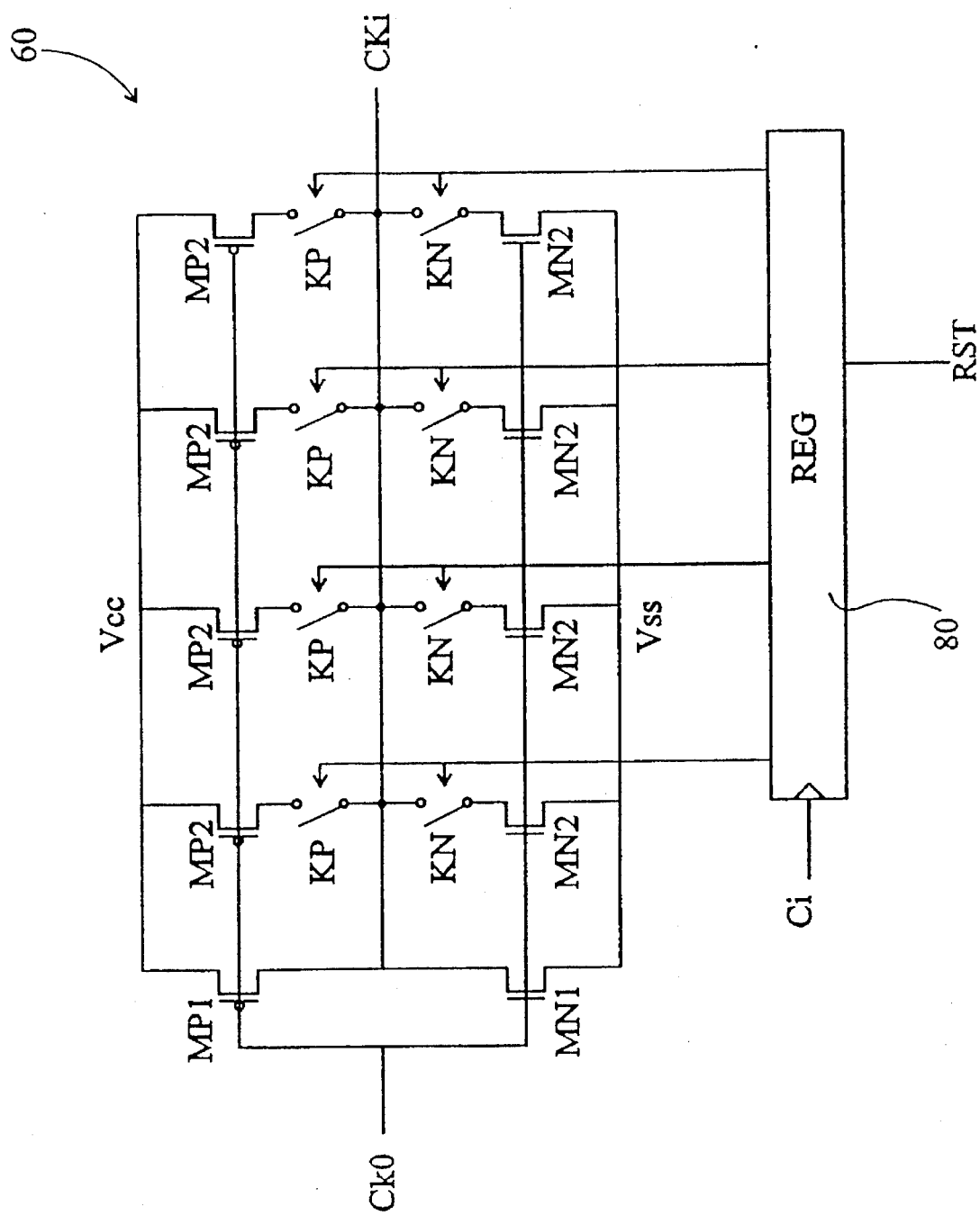
FIG. 8 represents in more detail another element of the circuit of FIG. 6.

FIG. 8 represents an embodiment of an amplifier 60 having an adjustable output impedance providing a clock signal CKi. Amplifier 60 includes a first inverter constituted by a P-channel MOS transistor MP1 and by an N-channel MOS transistor MN1 whose drains are connected to a high voltage Vcc and to a low voltage Vss, respectively, and whose sources are interconnected to form the output of the inverter, and whose gates are interconnected to form the input of the inverter, receiving the signal CK0.

A plurality of additional inverters, formed by P-channel MOS transistors MP2 and N-channel MOS transistors MN2, can be connected in parallel with the inverter MP1/MN1 or disconnected. The sources of transistors MP2 are connected to voltage Vcc and the sources of transistors MN2 are connected to voltage Vss. The drains of transistors MP2 and MN2 are connected with the clock output CKi through switches KP and KN, respectively. The two switches KP and KN of each inverter MP2/MN2 are controlled by a respective bit of a register 80. Register 80 is connected either as a shift register or as a counter. The content of register 80 is initialized by signal RST so that all the inverters MP2/MN2 are connected in parallel with inverter MP1/MN1 so that the output impedance of the amplifier 60 is minimum.

If register 80 is connected as a shift register, all the transistors MP2 and MN2 have the same size. To progressively decrease the output impedance of the amplifier, successive pulses of the control signal Ci introduce successive 1 s in the shift register 80, so as to disconnect one inverter MP2/MN2 at each pulse.

If the register 80 is connected as a counter, it is successively incremented by pulses of the control signal Ci. In this case, the transistors of an inverter MP2/MN2 that is associated with the bit of rank 0 of register 80 have a determined surface and the transistors of an inverter MP2/MN2 that is associated with the bit of rank i of register 80 have a surface $2^i$ times greater. This approach provides a large number of variation steps of the output impedance of the amplifier 60 with a small number of inverters and with a register having a small number of bits.

As is apparent to those skilled in the art, various modifications can be made to the above described preferred embodiment. For example, the active states of the signals, described as being at 1, can be inverted; those skilled in the art will be able to choose adequate processing logic circuits.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A circuit for indicating a first or a last signal activated among a plurality of signals, comprising:

a plurality of flip-flops respectively associated with a plurality of pairs of the plurality of signals, a first signal of each pair being applied to a reset input of a flip-flop and a second signal of each pair being applied to a set input of the flip-flop; and a plurality of logic gates, each logic gate being respectively associated with one of the plurality of signals, and connected to outputs of a group of flip-flops of the plurality of the flip-flops, each flip-flop of the group of flip-flops receiving the one of the plurality of signals respectively associated with the logic gate, as one of a first signal and a second signal of a pair respectively associated with the flip-flop, an output signal provided by each of the plurality of logic gates indicating whether the respectively associated one of the plurality of signals is the first or the last activated signal relative to all of the plurality of signals.

2. The indication circuit of claim 1, wherein the plurality of flip-flops includes a flip-flop for each pair of signals, the pairs being formed so that two distinct signals occur only once in a pair, and wherein the output signal provided by each logic gate indicates that the respectively associated one of the plurality of signals is the first or the last activated signal relative to all of the plurality of signals when the flip-flops of the group of flip-flops having outputs connected to the logic gate are in a particular state.

3. The indication circuit of claim 1, wherein the signals are periodic signals having a same frequency, the circuit further comprising:

a register coupled to outputs of the plurality of logic gates, and enabled when each of the plurality of signals is in an active state.

4. An adjustment circuit for adjusting the skew between several clock signals that have a same frequency and are respectively provided by a plurality of delay devices, wherein an output impedance of each delay device is independently adjustable, said adjustment circuit including:

an indication circuit that indicates the clock signal having a maximum phase lag; and control means for controlling output impedances of the plurality of delay devices, wherein the control means controls an increase of the output impedance of the respective delay device that provides the clock signal having the maximum phase lag independently from controlling other delay devices of the plurality of delay devices, wherein said control means includes means for incrementing an impedance of a particular delay device associated with a particular clock signal in phase advance of the clock signal having the maximum phase lag until an output signal of a flip-flop of the indication circuit indicates that the particular clock signal is no longer in phase advance, and wherein each delay device includes a plurality of inverters that may be individually connected in parallel with a first inverter, depending on the state of a register whose content is modified by successive pulses provided by the control means.

5. A circuit for adjusting a phase relation between a plurality of signals, the circuit comprising:

means for outputting the plurality of signals;

means for receiving and comparing the outputted plurality of signals, and outputting a result indicating a phase relation between the outputted plurality of signals, wherein the means for receiving and comparing, and outputting includes means for identifying a particular signal of the outputted plurality of signals having a maximum phase lag; and means for receiving the outputted result, and adjusting the means for outputting the plurality of signals to modify a skew between two signals according to the outputted result the phase relation being adjusted when the skew is modified.

6. The circuit of claim 5, wherein the means for receiving and comparing, and outputting further includes means for generating the result according to the identified particular signal.

7. The circuit of claim 6, wherein the result includes each signal of the plurality of signals except the identified particular signal, and a substitute signal that replaces the identified particular signal.

8. A circuit for adjusting a phase relation between a plurality of signals, the circuit comprising:

means for outputting the plurality of signals;

means for receiving and comparing the outputted plurality of signals, and outputting a result indicating a phase relation between the outputted plurality of signals; and means for receiving the outputted result, and adjusting the means for outputting the plurality of signals to modify a skew between two signals according to the outputted result, the phase relation being adjusted when the skew is modified, wherein the means for receiving and adjusting includes means for selecting a set of signals of the plurality of signals to be delayed according to the received result.

9. The circuit of claim 8, wherein the means for outputting the plurality of signals includes means for delaying the plurality of signals according to the set of signals selected by the means for selecting.

10. The circuit of claim 9, wherein the means for delaying includes means for increasing a corresponding output impedance for each signal, a signal being delayed when the corresponding output impedance is increased.

11. The circuit of claim 10, wherein the means for increasing a corresponding output impedance for each signal includes means for switchably configuring a number of discrete impedance sources to increase the output impedance.

12. A circuit for adjusting a phase relation between a plurality of signals, the circuit comprising:

a signal output stage that outputs the plurality of signals;

a comparison circuit that receives and compares the outputted plurality of signals, and outputs a result indicating a phase relation between the outputted plurality of signals, wherein the comparison circuit includes an identification circuit that identifies a particular signal of the outputted plurality of signals having a maximum phase lag; and a control circuit that receives the outputted result and adjusts the signal output stage to modify a skew between two signals according to the outputted result, the phase relation between adjusted when the skew is modified.

13. The circuit of claim 12, wherein the comparison circuit further includes a generation circuit that generates the result according to the identified particular signal.

14. The circuit of claim 13, wherein the result includes each signal of the plurality of signals except the identified particular signal, and a substitute signal that replaces the identified particular signal.

15. A circuit for adjusting a phase relation between a plurality of signals, the circuit comprising:

a signal output stage that outputs the plurality of signals;

a comparison circuit that receives and compares the outputted plurality of signals, and outputs a result indicating a phase relation between the outputted plurality of signals; and a control circuit that receives the outputted result and adjusts the signal output stage to modify a skew between two signals according to the outputted result, the phase relation between adjusted when the skew is modified, wherein the control circuit includes logic circuitry that outputs a set of delaying pulses to the signal output stage according to the received result.

16. The circuit of claim 15, wherein the signal output stage includes a plurality of amplifiers that receive the set of delaying pulses from the controlling stage.

17. The circuit of claim 16, wherein each amplifier of the plurality of amplifiers has an adjustable output impedance, each amplifier increasing the adjustable output impedance of the amplifier upon receipt of a delaying pulse from the controlling stage, a signal being delayed when the corresponding output impedance is increased.

18. The circuit of claim 17, wherein each amplifier further includes an impedance circuit that switchably configures a plurality of inverters to increase the output impedance.

19. A method for adjusting the phase relation between a plurality of signals, the method comprising the steps of:

(A) outputting the plurality of signals:

(B) receiving and comparing the outputted plurality of signals, and outputting a result indicating a phase relation between the outputted plurality of signals, wherein the step step of receiving and comparing, and outputting includes the step of identifying a particular signal having a maximum phase lag; and (C) receiving the result, and adjusting a skew between two signals according to the outputted result, the phase relation being adjusted when the skew is modified.

20. The method of claim 19, wherein step (B) further includes the step of generating the result according to the identified particular signal.

21. The method of claim 20, wherein the step of generating the result includes the step of providing each signal of the plurality of signals with the identified particular signal being replaced with a substitute signal.

22. A circuit for adjusting the phase relation between a plurality of signals, the method comprising the steps of:

(A) outputting the plurality of signals;

(B) receiving and comparing the outputted plurality of signals, and outputting a result indicating a phase relation between the outputted plurality of signals; and (C) receiving the result, and adjusting a skew between two signals according to the outputted result, the phase relation being adjusted when the skew is modified, wherein the step of receiving and adjusting includes the step of selecting a set of signals of the plurality of signals to be delayed according to the received result.

23. The method of claim 22, wherein step (A) includes the step of delaying the plurality of signals according to the set of signals selected in step (C).

24. The method of claim 23, wherein the step of delaying includes the step of increasing the corresponding output impedance for each signal, a signal being delayed when the corresponding output impedance is increased.

25. The method of claim 24, wherein the step of increasing the corresponding output impedance for each signal includes the step of switchably configuring a number of discrete impedance sources to increase the output impedance.

26. A circuit for indicating a phase relation between a plurality of signals, wherein each signal has an activation edge, the circuit comprising:

means for comparing a plurality of pairs of signals of the plurality of signals, and outputting a plurality of comparison results, comparison result being outputted for each compared pair of signals, wherein the means for comparing includes a plurality of means for receiving a first signal and a second signal of one of the pair of signals, and outputting one of the comparison results indicating an order of receipt of the activation edges of the first signal and the second signal; and means for receiving the plurality of comparison results, and outputting an identification result identifying a particular signal of the plurality of signals as having one of a maximum phase lag and a maximum phase advance relative to the other signals of the plurality of signals according to the comparison results, wherein the means for receiving the plurality of comparison results and outputting an identification result includes means for receiving the plurality of signals, and outputting the identification result when the activation edges of each signal are received.

27. A circuit for indicating a phase relation between a plurality of signals, wherein each signal has an activation edge, the circuit comprising:

a plurality of flip-flops that compare a plurality of pairs of signals of the plurality of signals, and outputs a plurality of comparison results, a comparison result being outputted for each compared pair of signals, wherein each flip-flop includes a set input that receives a first signal and a reset input that receives a second signal of one of the pair of signals, and an output that outputs one of the comparison results indicating an order of receipt of the activation edges of the first signal and the second signal; and logic circuitry that receives the plurality of comparison results, and outputs an identification result identifying a particular signal of the plurality of signals as having one of a maximum phase lag and an maximum phase advance relative to the other signals of the plurality of signals according to the comparison results.

28. The circuit of claim 27, wherein the logic circuitry includes an enabling stage that receives the plurality of signals, and outputs the identification result when the activation edges of each signal are received.

29. A method for indicating a phase relation between a plurality of signals, wherein each signal has an activation edge, the method including the steps of:

(A) comparing a plurality of pairs of signals of the plurality of signals, and outputting a plurality of comparison results, a comparison result being outputted for each compared pair of signals, wherein the step of comparing and outputting includes the step of receiving, for each pair of signals, a first signal and a second signal of one of the pair of signals, and outputting one of the comparison results indicating an order of receipt of the activation edges of the first signal and the second signal; and (B) receiving the plurality of comparison results, and outputting an identification result identifying a particular signal of the plurality of signals as having one of a maximum phase lag and a maximum phase advance relative to the other signals of the plurality of signals according to the comparison results, wherein the step of receiving the plurality of comparison results and outputting an identification result includes the step of receiving the plurality of signals, and outputting the identification result when the activation edges of each signal are received.

* * * * *